United States Patent [19]

Nakamura et al.

[11] Patent Number: 5,355,017
[45] Date of Patent: Oct. 11, 1994

[54] LEAD FRAME HAVING A DIE PAD WITH METAL FOIL LAYERS ATTACHED TO THE SURFACES

[75] Inventors: Yasuyuki Nakamura; Shin Nemoto, both of Suita, Japan

[73] Assignee: Sumitomo Special Metal Co. Ltd., Osaka, Japan

[21] Appl. No.: 979,489

[22] Filed: Nov. 20, 1992

Related U.S. Application Data

[63] Continuation of Ser. No. 776,694, Oct. 16, 1991, abandoned, which is a continuation of Ser. No. 563,709, Aug. 1, 1990, abandoned.

[30] Foreign Application Priority Data

Apr. 6, 1990 [JP] Japan ................. 2-29554
Apr. 6, 1990 [JP] Japan ................. 2-92553

[51] Int. Cl.[5] .................. H01L 23/48; H01L 29/44; H01L 29/52; H02B 1/00
[52] U.S. Cl. ..................... 257/666; 257/675; 257/676; 257/677; 257/712; 257/762
[58] Field of Search ............. 357/70, 71, 72, 81; 361/386, 379, 389; 257/666, 668, 672, 675, 676, 677, 690, 692, 693, 712, 713, 720, 734, 762, 767, 796, 677

[56] References Cited

U.S. PATENT DOCUMENTS

| | | | |
|---|---|---|---|
| 3,404,319 | 10/1968 | Tsuji et al. | 357/72 |
| 4,234,666 | 11/1980 | Gursky | 357/70 |
| 4,427,993 | 1/1984 | Fichot et al. | 357/81 |
| 4,604,642 | 8/1986 | Sakurai | 357/70 |
| 4,707,724 | 11/1987 | Suzuki et al. | 357/71 |
| 4,774,635 | 9/1988 | Greenberg et al. | 357/70 |
| 4,849,857 | 7/1989 | Butt et al. | 357/70 |
| 4,942,454 | 7/1990 | Mori et al. | 357/72 |

Primary Examiner—William D. Larkins
Assistant Examiner—Carl Whitehead, Jr.
Attorney, Agent, or Firm—Watson, Cole, Grindle & Watson

[57] ABSTRACT

In a lead frame material made of a strip of copper or copper alloy sheet for use in resin packages in which semiconductor chips are mounted to and resin-sealed in island portions of a lead frame fabricated from a strip of substrate material, the lead frame material includes selective spot-clad material in which metal foils of low thermal expansion, each of a predetermined size, are roll-bonded and arranged at a predetermined interval to respective positions to be formed with island portions in the longitudinal direction of the substrate material, either on the surface where the semiconductor chips are not to be mounted or on both the surface where the semiconductor chips are to be mounted and on the opposite side. Damage to the chips such as warping or peeling can be prevented during heating upon mounting them.

12 Claims, 7 Drawing Sheets

PRIOR ART

LEAD FRAME HAVING A DIE PAD WITH METAL FOIL LAYERS ATTACHED TO THE SURFACES

CROSS REFERENCE TO RELATED APPLICATIONS

This application is a continuation of application Ser. No. 776,694, filed Oct. 16, 1991, now abandoned, which was a continuation of application Ser. No. 563,709, filed Aug. 1, 1990, now abandoned.

BACKGROUND OF THE INVENTION

1. Field of the Invention

The present invention concerns a Cu series lead frame material for use in resin-sealed semiconductor packages, having excellent heat dissipation in a state of mounting a semiconductor chip of large capacity and capable of preventing damages of the chip due to the disconformity of thermal expansion coefficient with that of the chip and, more in particular, it relates to a lead frame material for use in resin packages, in which metal foils of low thermal expansion are selectively clad in a spot-like pattern to a Cu series lead frame material at the surface on the side reverse to the surface where a semiconductor chip is to be mounted or at the surface where the semiconductor chip is to be mounted and at the surface on the side reverse to it, so that thermal bondability between the Cu series material of excellent heat dissipation and the semiconductor chip of large capacity can be improved and warpings of the substrate, etc. during heating upon mounting the chip is reduced, thereby preventing damages to the chip such as peeling or cracking.

2. Description of the Prior Art

Integrated circuit chips (hereinafter referred to as "chips") of semiconductor packages, especially, those in LSI or ULSI for large-scaled computers are getting to attain higher degree of integration and increased operation speed and, therefore, the quantity of heat to be generated by the operation of the devices has become extremely large because of the increase of the electric power to be consumed in the operation.

That is, since the capacity of the chips has been increased and the quantity of heat to be generated during the operation has also become large, if the thermal expansion coefficient of the substrate material is significantly different from that of the material of the chip made of silicon or gallium arsenic, there is a problem that the chip would suffer from peeling or cracking.

In view of the above, heat dissipation capacity is taken into consideration in the design of semiconductor packages and, therefore, a heat dissipation capacity is required also for a chip-carrying substrare and a large thermal conductivity is required for the substrate material.

In a resin-sealed semiconductor package as shown in FIG. 10, a lead frame serves not only as a path of electrically connecting a chip to the outside but also has an important role as a path for releasing the heat generated from the chip.

That is, in the plastic package, a chip 2 is mounted on an island $1_1$ formed in the central portion of a lead frame 1 and is fixed thereon with brazing material, adhesive or solder. The chip 2 is also electrically connected with an inner lead $1_2$ by way of a bonding wire 3 and, further, sealed therearound with a resin 4.

The heat to be generated from the chip 2 reaches an outer lead $1_3$ of the lead frame 1 by way of a path including the island $1_1$, the resin 4 and the inner lead $1_2$ and is then released to the outside along with the outer surface of the resin 4.

Accordingly, the lead frame 1 is desired to be made of a material having a high thermal conductivity so that heat generated from the chip can be released to the outside of the semiconductor package.

On the other hand, peeling of the chip 2 from the island $1_1$ occurring in the bonding interface therebetween and cracking formed in the resin 4 are caused by the difference of the thermal expansion coefficient of the chip 2 from that of the sealing resin 4 and the lead frame 1. In order to prevent such damages, the conformity of the thermal expansion coefficient of the chip 2 with that of the resin 4 and the lead frame 1 is indispensable.

As described above, for the lead frames in the semiconductor packages made of synthetic resin material, those made of copper alloys with good thermal conductivity have generally been used in view of the heat dissipation capacity.

However, for the application use requiring high reliability, copper alloys are not so favorable since they have a poor conformity with chips with respect to the thermal expansion coefficient and there may be a worry of peeling at the bonding interface between the chip and the island or cracking in the chip. Accordingly, it has been proposed a semiconductor package using Ni—Fe series alloy of low thermal expansion coefficient such as 42% Ni—Fe series alloy in view of the conformity of the thermal expansion coefficient relative to the chip.

However, since the Ni—Fe series alloy is poor in the thermal conductivity, no sufficient heat releasability as satisfying the present demand has yet been obtained. In addition, the difference of the thermal expansion between the chip and the sealing resin is extremely large. Accordingly, even if the conformity of the thermal expansion coefficient is satisfactory between the lead frame and the chip, the conformity between the lead frame and the resin is poor, so that it has been difficult to completely prevent the cracking in the sealing resin.

SUMMARY OF THE INVENTION

In view of the foregoing problems in the prior art that no thermal conformity can be obtained between the Cu series lead frame material and the chip in resin packages, it is an object of the present invention to provide a lead frame material for use in resin packages capable of improving the thermal bondability between the Cu series material of excellent heat dissipation and the semiconductor chip of large capacity and reducing warping etc. of a substrate during heating upon mounting the chip, thereby preventing damages to the chip such as peeling or cracking.

The present inventors have made various studies on the bending of island portions during heating upon mounting the chip with an aim of improving the thermal bondability between a copper or copper sheet of excellent heat dissipation and a chip of large capacity and, as a result, have found that the warping, etc. on the side of the substrate during heating upon mounting the chip can be reduced to prevent damages to the chip such as peeling or cracking, by selectively cladding metal foils of low thermal expansion in a spot-like pattern to the alloy sheet at the surface on the side reverse to the surface where a semiconductor chip is to be mounted.

Then, we have made a further study and, as a result, have found that warping, etc. can be reduced by selectively cladding metal foils having a low thermal expansion coefficient nearly equal with that of a semiconductor chip in a spot-like pattern to the alloy sheet at the surface where the chip is to be mounted at the surface on the side reverse to it thereby reducing the difference in the thermal expansion coefficient relative to that of the chip and have accomplished the present invention capable of dissolving the foregoing problems based on such a finding.

That is, the present invention provides a lead frame material made of a strip of copper or copper alloy sheet for use in resin packages, in which semiconductor chips are mounted and resin-sealed to island portions of a lead frame fabricated from a strip of substrate material by means of punching, etc, wherein the lead frame material comprises a selective spot-clad material in which a predetermined distance metal foils of low thermal expansion each of a predetermined size are roll-bonded and arranged each at a predetermined interval to the substrate at respective positions to be formed with island portions in the longitudinal direction thereof, at the surface on the side reverse to the surface where semiconductor chips are to be mounted or at the surface where the semiconductor chips are to be mounted and at the surface on the side reverse to it.

DESCRIPTION OF THE PREFERRED EMBODIMENTS

The present invention proposes two principal constitutions, that is, it includes a first invention in which metal foils of low thermal expansion are bonded to a Cu series substrate material only on the required side (a surface where semiconductor chips are not to be mounted) and a second invention in which the metal foils are bonded to the Cu series substrate on the side of the surface where the semiconductor chips are to be mounted and at the surface on the side reverse to it.

Each of the inventions will be explained more specifically referring to the constitutions shown in embodiments.

Figure 1:
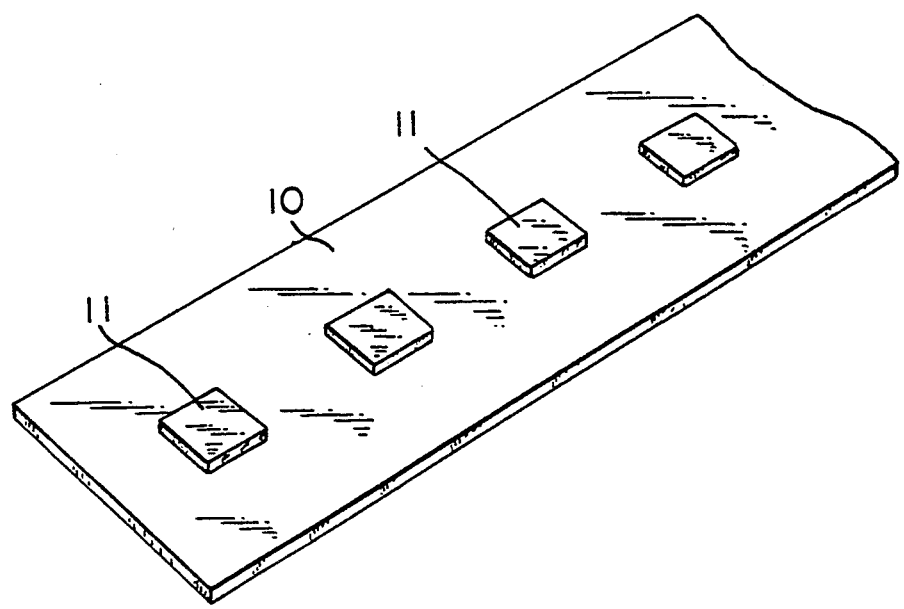
FIG. 1 is an explanatory perspective view showing one embodiment of a lead frame material according to the first invention.

As shown in FIG. 1, the lead frame material according to the first invention comprises a selective spot-clad material, in which metal foils 11 of low thermal expansion each of a predetermined size are bonded and arranged at a predetermined interval on the required side of the surface of a strip of Cu series substrate material 10 made of copper or copper alloy.

Referring more specifically, the strip of Cu series substrate material 10 is shaped by punching into a plurality of lead frames of a required pattern, in which the metal foils 11 of low thermal expansion each of a predetermined size are roll-bonded and arranged at a predetermined interval in the longitudinal direction of the Cu series substrate material 10 to respective positions to be formed with island portions at the surface on the side reverse to the surface where semiconductor chips are to be mounted.

As described later, each of the metal foils 11 of low thermal expansion has such thickness and size as selected while taking the thickness of the Cu series substrate material 10, the size of the chip to be mounted, etc. into consideration.

Figure 2A:
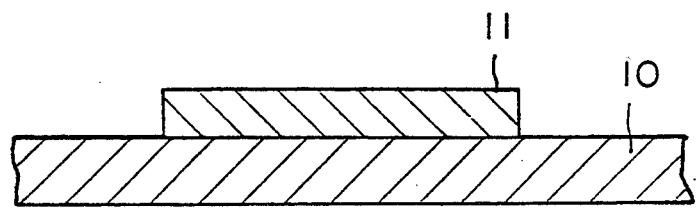
FIGS. 2a, b and c are explanatory longitudinal sectional views showing one embodiment of the lead frame material clad with metal foils of low thermal expansion according to the first invention.

Further, upon roll-bonding the metal foil with the Cu series substrate material 10, the metal foils 11 of low thermal expansion may be roll-bonded to the surface of the Cu series substrate material 10, as well as they may be roll-bonded while being partially or entirely embedded into the substrate material, as shown in FIGS. 2a, b and c.

Figure 2B:
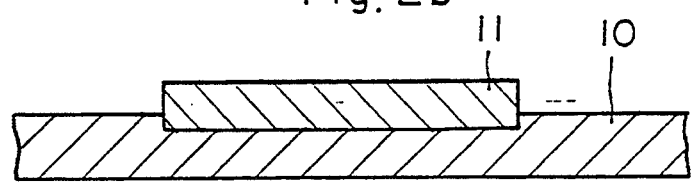
Figure 2C:
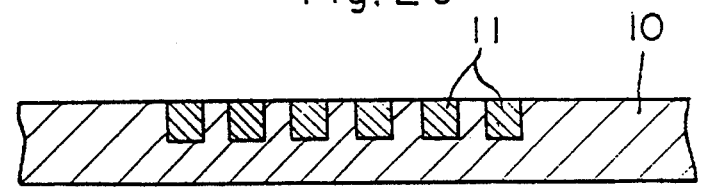

Further, the metal foil 11 of low thermal expansion may be a so-called punched metal sheet Formed with various shapes of apertures as shown in FIG. 2c. In this case, since the Cu series substrate material intrudes in the apertures, thermal expansion coefficient can be selected to optional values between the copper or copper alloy and the metal material of low heat expansion in accordance with the volume ratio between the copper or copper alloy and the metal material of low thermal expansion.

Figure 3:
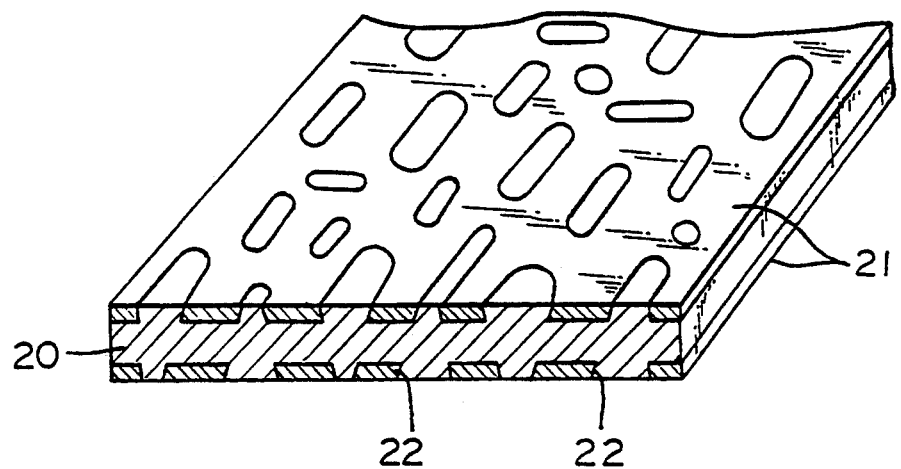
FIG. 3 is an explanatory perspective view showing one embodiment of metal foils of low thermal expansion used in the first and the second inventions.
Figure 10:
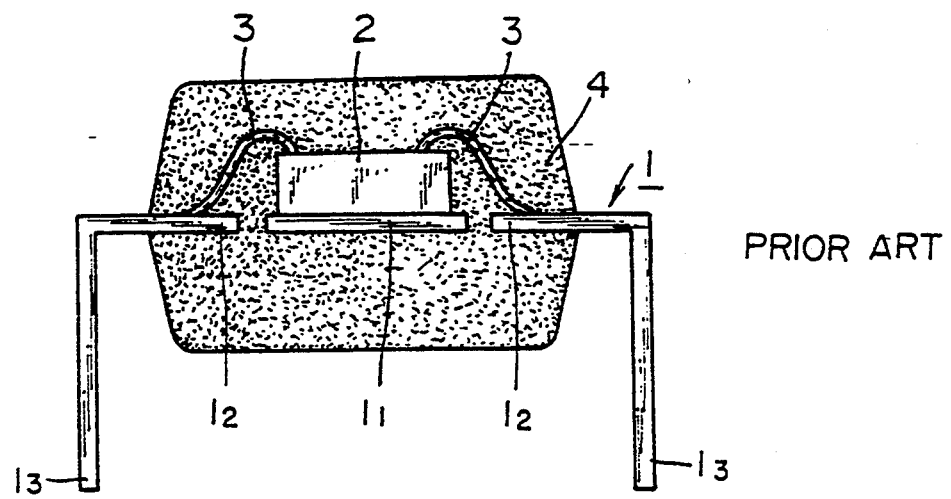
FIG. 10 is an explanatory longitudinal sectional view for a conventional resin package.

Further, as shown in FIG. 3, if a metal sheet 21 of low thermal expansion having a plurality of through holes 22 Formed in the direction of the thickness is roll-bonded and integrated with at least one main surface of the copper or copper alloy sheet 20, so that copper or copper alloy is partially exposed through the through holes 22 to the surface of the metal sheet 21 of low thermal expansion and the volume ratio is properly selected between the copper or copper alloy and the metal material of low thermal expansion, the values of the heat expansion coefficient can optionally be selected between the copper or copper alloy and the metal material of low thermal expansion. Other metal materials may be used instead of copper or copper alloy.

For the Cu series substrate material 10, there can be used, in addition to pure Cu, any of known Cu alloys such as Cu—Sn, Cu—Fe, Cu—Zn, Cu—Co, Cu—Ni, Cu—Zr or Cu series alloys further incorporated with P, Cr, etc., which can be selected properly depending on the application use, required performance, etc.

For the metal foil 11 of low thermal expansion, there can be used, in addition to the Ni—Fe series alloys of various compositions such as 36 Ni—Fe alloy, 30 Ni—4Co—Fe alloy, 42 Ni—Fe alloy, any of known metal materials of low thermal coexpansion such as so-called Kovar alloy, Mo, Fe—Cr alloy, etc.

Figure 4A:
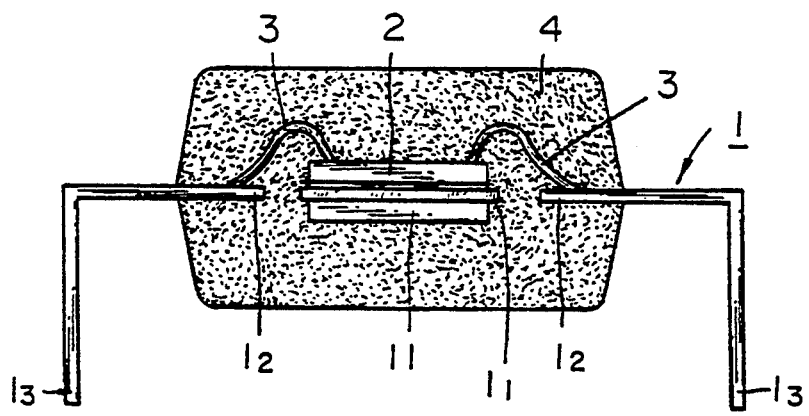
FIGS. 4a, b and c are, respectively, explanatory longitudinal sectional views for resin package using the lead frame material according to the third invention.

When various kinds of lead frame materials according to the present invention shown in FIGS. 2a, b and c are used and a plurality of lead frames of a required pattern are shaped in the longitudinal direction, for example, by punching and resin packages are prepared from the resultant lead frames, a chip 2 is placed on an island $1_1$ formed at the central portion of a lead frame 1 as shown in FIGS. 4a, b and c. The chip 2 is fixed by means of brazing material, adhesive or solder, electrically connected with an inner lead $1_2$ by means of a bonding wire 3 and then sealed therearound with a resin 4.

Figure 4B:
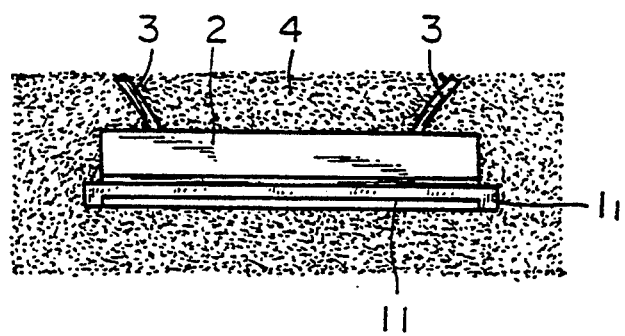
Figure 4C:
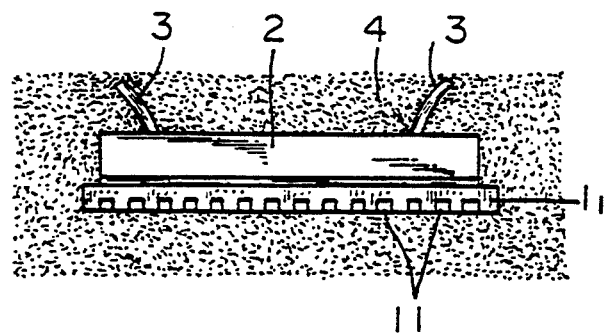

In the embodiment shown in FIG. 4a, a metal foil 11 of low thermal expansion is roll-bonded to an island $1_1$ at the surface on the side reverse to the surface where a chip 2 is to be mounted. In FIG. 4b, a metal foil 11 of low thermal expansion is entirely embedded to the inside of an island $1_1$ to be same thickness as other portions of the lead and, further, in FIG. 4c, a metal foil 11 of low thermal expansion constituted as a punched metal sheet is embedded to the inside of an island $1_1$.

In any of the packages shown in FIGS. 4a, b and c, heat generated from the chip 2 reaches by way of the path including the island $1_1$, the resin 4 and the inner lead $1_2$ to the lead $1_3$ of the lead frame 1 and then released to the outside. Since the entire path is made of the Cu series substrate material, the heat dissipation capacity is extremely good.

Further, in the island $1_1$ to be mounted with the chip 2, since the metal foil 11 of a required low thermal expansion is roll-bonded and embedded to the surface reverse to it, it scarcely warps upon heating, so that peeling, etc. at the bonding interface between the chip 2 and the island $1_1$ can be prevented to obtain a highly reliable resin package.

The lead frame material according to the first invention, as shown in FIG. 1, comprises a selective spot-clad material in which metal foils 11 of low thermal expansion are stacked to a strip of Cu series substrate material 10 made of copper or copper alloy, are roll-bonded, rolled and then arranged at a predetermined interval, the metal foil 11 being made of such material and having such thickness and size as selected while taking the thickness of the Cu series substrate 10 and the size of the chip to be mounted into consideration.

Such specific thickness and size of the metal foil 11 of low thermal expansion are selected mainly by confirming them in an actual mounting test and the following means can be adopted therefore as a general standard.

The island portion of the lead frame on which the chip is to be mounted is assumed as a composite material comprising the chip and the lead frame (substrate+metal foils of low thermal expansion) and conditions not bending the composite material are determined. That is, such conditions are determined that the amount of bending upon heating them with a temperature difference ΔT is identical between the amount of bending of the low thermal expansion materials placed on both surfaces of the substrate. Since the amount of bending is in proportion to the bending coefficient in the case of the composite material, conditions in which the bending coefficients become identical are determined.

Accordingly, the thickness of the metal foils of low thermal expansion may be determined preferably depending on the chip to be mounted and the thickness of the Cu series substrate while considering the relationship between the bending coefficients for each of the combinations of chip with substrate and substrate with metal foil of low thermal expansion, and the plate thickness ratio.

Figure 5A:
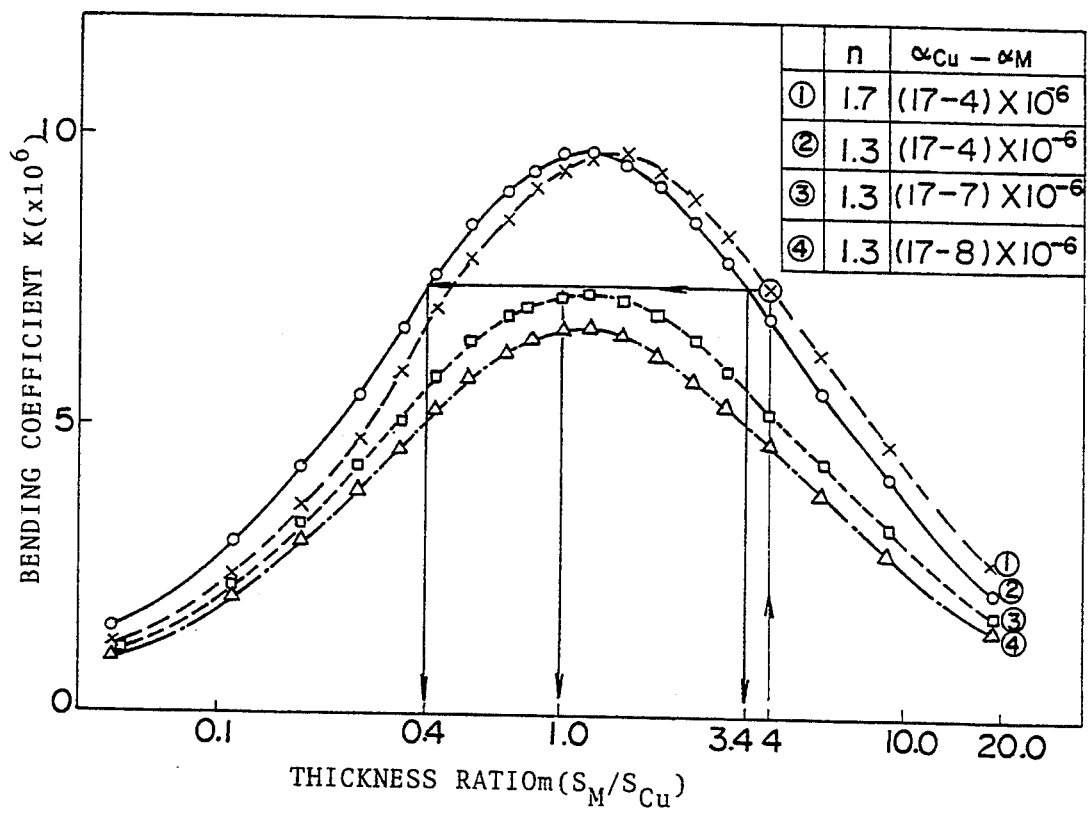
FIG. 5a is a graph showing a relationship between the thickness ratio of a substrate material to a cladding metal foil of low thermal expansion and the bending coefficient and FIG. 5b is an explanatory perspective view of a test material.
Figure 5B:
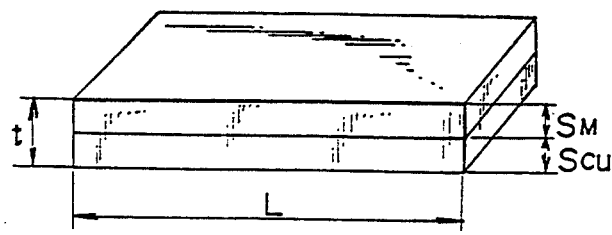

Referring, for instance, curve (1) in FIG. 5a shows the bending coefficient of a silicon chip (thermal expansion coefficient: $4 \times 10^{-6}$) and that of the Cu series substrate, curve (2) shows the bending coefficient of Cu series substrate+36 Ni—Fe and curves (3), (4) show the bending coefficients for Cu series substrate+Kovar (thermal expansion coefficient: $7-8 \times 10^{-6}$).

It can be seen that in a silicon chip of 0.4 mm thickness and Cu substrate of 0.1 mm thickness as shown in the example, the thickness of the 36 Ni—Fe material is preferably 0.34 mm or 0.04 mm and the thickness of Kovar is preferably about 0.1 m,.

Bending coefficient K:

$$K = \frac{3(\alpha_{Cu} - \alpha_M)(1 + m)^2}{3(1 + m)^2 + (1 + mn)\left(m^2 + \frac{1}{mn}\right)}$$

Bending amount D:

$$D = \frac{K \Delta T L^2}{t}$$

Thermal expansion coefficient α:

$\alpha$ Cu = copper $\alpha$ M = metal of low thermal expansion

Plate thickness ratio m:

$$m = S_M/S_{Cu}$$

Young's modulus ratio n:

$$n = E_M/E_{Cu}$$

$E_{Cu}$ = copper $E_M$ = metal of low thermal expansion

Length for composite material = L,
Thickness for composite material = t

As described above, metal foils of low thermal expansion of such material, thickness and size as selected in view of the kind and the thickness of the Cu series substrate, the size of the chip to be mounted, etc. are stacked, roll-bonded and rolled till a required thickness ratio is obtained. It is necessary that the metal foil of low thermal expansion selectively clad in a spot-like pattern along the longitudinal direction of the Cu series substrate material has pitch and size at high accuracy when it is fabricated into a lead frame.

A selective spot-clad material having pitch and size high accuracy can be obtained, For example, by provisionally fixing a metal foil and a Cu series substrate material by means of continuous supersonic welding at a predetermined interval after they uncoiled and intermittently fed each by a predetermined length, cutting the metal foil at a predetermined interval by a pair of rotary cutters thereby removing not-fixed metal foil pieces, by seizing and cutting a metal foil which is intermittently fed each at a predetermined length by means of a punching tool and, simultaneously, spot welding them on a Cu series substrate material which is also fed intermittently each at a predetermined length using an electrode incorporated in the punching tool or the provisionally fixing them by supersonic welding using a supersonic welding vibration plate incorporated in a punching tool and then roll-bonding and rolling them.

Further, the selective spot-clad material can also be obtained by provisionally fixing a metal foil and a Cu series substrate material, which are fed intermittently each at a predetermined length, by means of laser welding continuously at a predetermined interval, removing not-fixed metal foil pieces by cutting the metal foil at a predetermined interval by means of a rotary cutter or by seizing and cutting the metal foil intermittently fed at a predetermined length and then provisionally fixing it on the Cu series substrate material which is also fed intermittently at a predetermined length by means of laser welding while urging by means of the punching tool and then roll-bonding and rolling them. In this case, a high accuracy pitch control can be attained by abutting backup rolls to a pair of work rolls of a rolling mill and providing a device for detecting the load upon pressurizing the uncoiled Cu series substrate material and a plate thickness gage, and applying a constant load control by a rolling load controller, while determining quantitative relationship between the variations of the rolling load and the variations of the pitch and the absolute position based on the measured value for the absolute position of the metal foil from a required original point and a control model and by calculating the aimed rolling load (refer to Japanese Patent Applications Hei 1-102316, Hei 1-216758, Hei 1-216759 and Hei 1-216760). In addition to the manufacturing method using the roll-bonding and the rolling mill as described above, the metal foil pieces can be embedded into and arranged on the Cu series substrate material also by means of pressing machine.

In a case where the metal foil 11 of low thermal expansion is bonded to the Cu series substrate material 10 by means of a so-called pin-down bonding, similar effect for preventing bending can also be obtained. Further, in a case where the metal foil 11 of low thermal expansion is embedded to the surface of the Cu series substrate material 10 on the side reverse to the area to be formed with an island as shown in FIG. 2b, the bending preventive effect can similarly be obtained by merely seizing the metal foil 11 only at the thickness end face thereof along the thickness.

Figure 6:
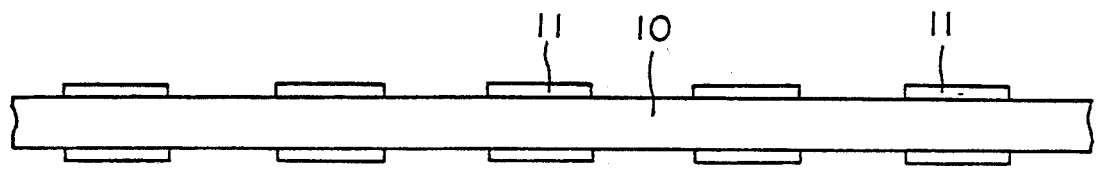
FIG. 6 is an explanatory view showing one embodiment of a lead frame material according to the second invention.

The lead frame according to the second invention comprises a selective spot-clad material as shown in FIG. 6, in which metal foils 11 of low thermal expansion each of a predetermined size are bonded and arranged each at a predetermined interval on both surfaces of a strip of Cu series substrate material 10 made of copper or copper alloy.

Referring more specifically, the strip of Cu series substrate material 10 is shaped by punching into a plurality of lead frames of a required pattern in the longitudinal direction, in which metal foils 11 of low thermal expansion each of a predetermined size are roll-bonded and arranged each at a predetermined interval in the longitudinal direction to the Cu series substrate material 10 at each of areas to be formed with islands in the longitudinal direction, on the side of the surface where semiconductor chips are to be mounted and at the surface on the side reverse to it.

The metal foil 11 of low thermal expansion has such thickness and size as selected in view of the thickness of the Cu series substrate material 10 and the size of the chip to be mounted, etc. as described later.

Figure 7A:
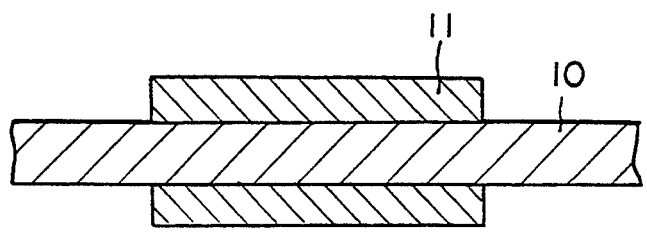
FIGS. 7a, b and c are explanatory longitudinal sectional views showing one embodiment of the lead frame material clad with a metal foil of low thermal expansion according to the second invention.

Further, for the roll-bonding with the Cu series substrate material 10, the metal foil 11 of low thermal expansion may be roll-bonded to the surface of the Cu series substrate material 10, or the foil may be partially or entirely embedded into and roll-bonded to the side of the substrate material as shown in FIGS. 7a, b and c.

Further, when the metal foil 11 of low thermal expansion is constituted as a so-called punched metal sheet having various shapes of apertures, since the Cu series substrate material intrudes into the apertures, values for the thermal expansion coefficient can optionally be selected between the copper or copper alloy and the low thermal expansion metal material in accordance with the volume ratio between the copper and the copper alloy and the low thermal expansion metal material.

Further, as the metal foil 11 of low thermal expansion, it is possible to use a composite material comprising a copper or copper alloy sheet 20 and a metal sheet 21 of low thermal expansion which are roll-bonded and integrated to each other in the same manner as in the first invention shown in FIG. 3.

Further, various known materials can be used for the Cu series substrate material 10 and the metal foil 11 of low thermal expansion like that in the first invention.

Figure 8A:
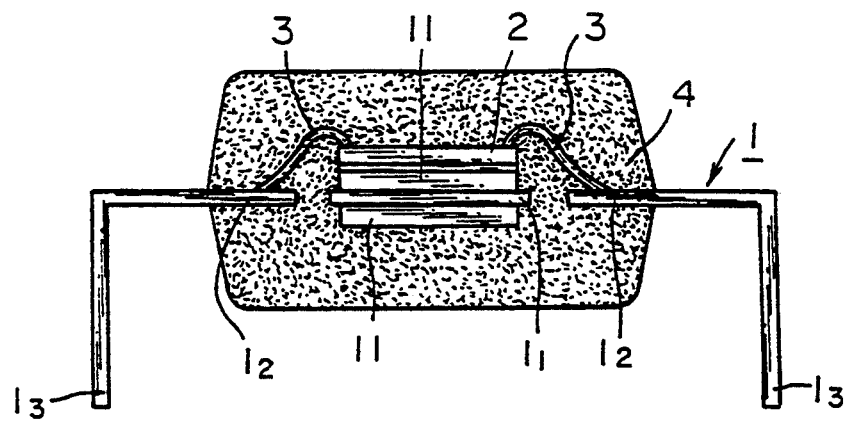
FIGS. 8a, b and c are, respectively, explanatory longitudinal sectional views for the plastic package and the detailed view for a part thereof using the lead frame material according to the second invention.

When various kinds of lead frame materials according to the present invention shown in FIGS. 7a, b and c are used and a plurality of lead frames of a required pattern are shaped in the longitudinal direction, for example, by punching and resin packages are prepared from the resultant lead frames, a chip 2 is placed on an island $1_1$ formed at the central portion of a lead frame 1 as shown in FIGS. 8a, b and c. The chip 2 is fixed by means of brazing material, adhesive or solder, electrically connected with an inner lead $1_2$ by means of a bonding wire 3 and then sealed there-around with a resin 4.

Figure 8B:
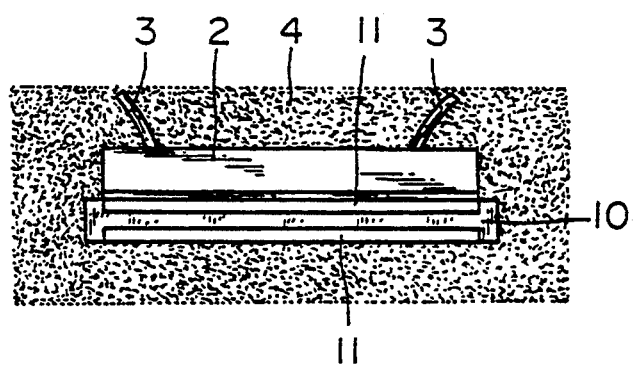
Figure 8C:
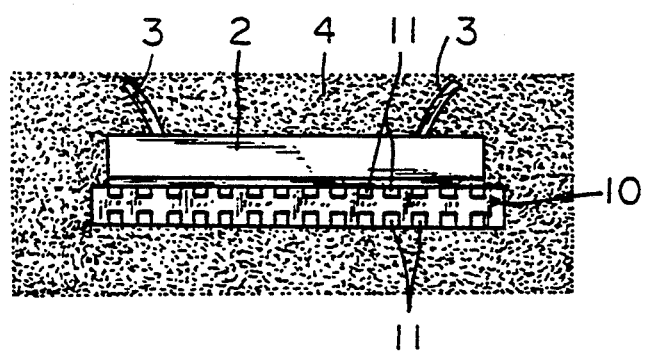
Figure 9A:
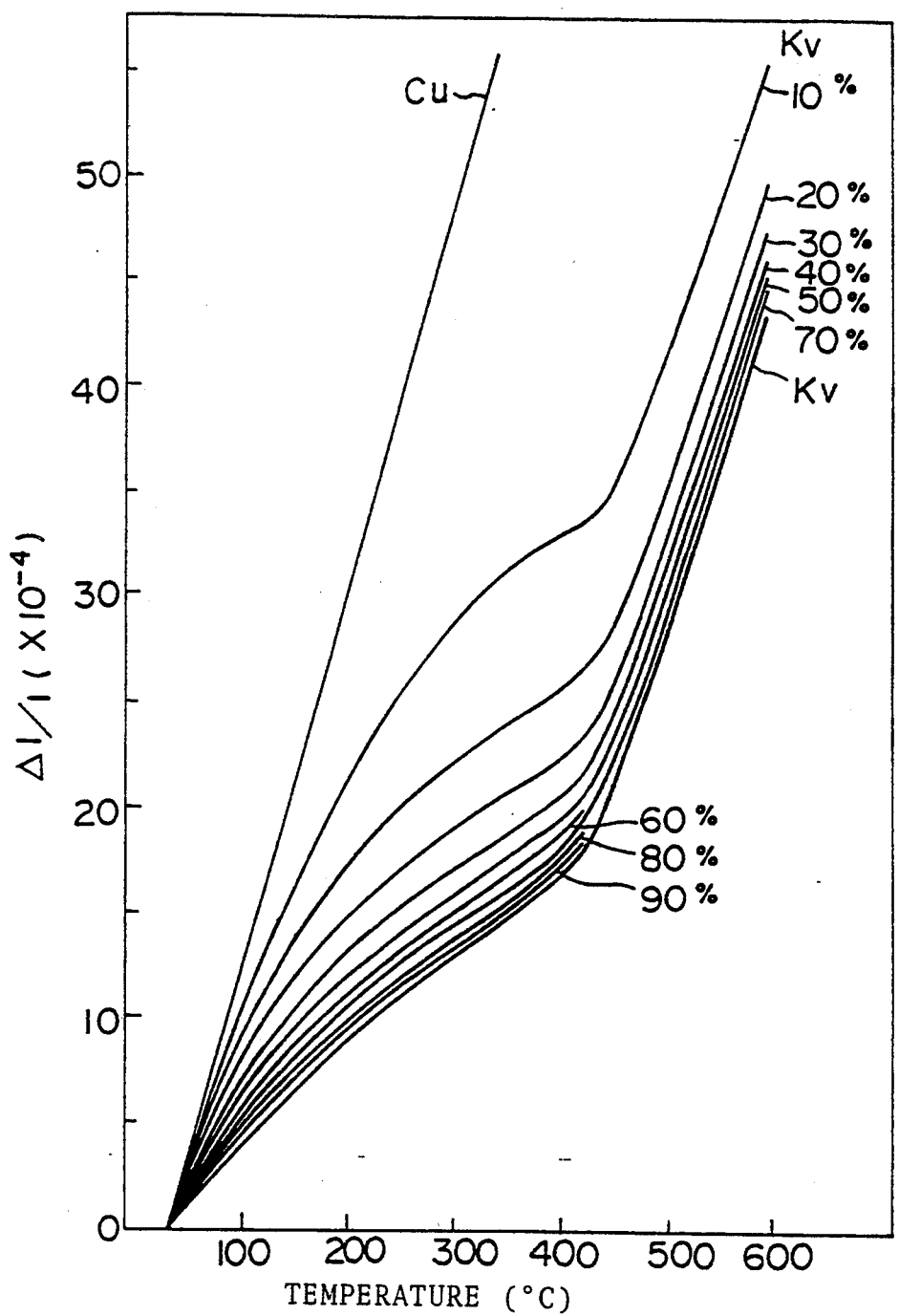
FIG. 9a is a graph showing a relationship between the temperature and the thickness ratio of the cladding metal foil of low thermal expansion and the substrate material and FIG. 9b is an explanatory perspective view of a test material.
Figure 9B:
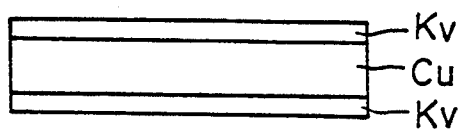

In the embodiment shown in FIG. 8a, a metal foil 11 of low thermal expansion is roll-bonded to an island $1_1$ at the surface on the side reverse to the surface where a chip 2 is to be mounted. In FIG. 8b, a metal foil 11 of low thermal expansion is entirely embedded to the inside of an island $1_1$ being same thickness as other portions of the lead and, further, in FIG. 8c, a metal foil 11 of low thermal expansion constituted as a punched metal sheet is embedded to the inside of an island $1_1$.

In any of the packages shown in FIGS. 8a, b and c, heat generated from the chip 2 reaches by way of the path including the island $1_1$, the resin 4 and the inner lead $1_2$ to the lead $1_3$ of the lead frame 1 and then released to the outside. Since the entire path is made of the Cu series substrate material, the heat dissipation capacity is extremely good.

Further, in the island $1_1$ to be mounted with the chip 2, since the metal foil 11 of a required low thermal expansion is roll-bonded and embedded to the surface reverse to it, it scarcely warps upon heating, so that peeling, etc. at the bonding interface between the chip 2 and the island $1_1$ can be prevented to obtain a highly reliable resin package.

The lead frame material according to the second invention, as shown in FIG. 6, comprises a selective spot-clad material in which metal foils 11 of low thermal expansion are stacked to a strip of Cu series substrate material 10 made of copper or copper alloy, are roll-bonded, rolled and then arranged at a predetermined interval, the metal foil 11 being made of such material and having such thickness and size as selected while taking the thickness of the Cu series substrate 10 and the size of the chip to be mounted into consideration.

Such specific thickness and size of the metal foil 11 of low thermal expansion are selected mainly by confirming them in an actual mounting test and the following means can be adopted therefore as a general standard.

In a case where the metal foils of low thermal expansion are roll-bonded to both surfaces of the Cu series substrate material, the heat expansion coefficient can be calculated based on the thickness ratio for the entirely clad three layered material: metal material of low thermal expansion (M)/Cu series substrate material/M. Further, the thermal expansion coefficient can be estimated in the same manner also in the case where the metal foil comprises a punched metal sheet (hereinafter referred to as HS material).

Calculation procedures are as follows.
(a) Thermal expansion coefficient ($\alpha$) for the metal material of low thermal expansion (M) and that for the Cu series substrate material are measured.
(b) Thermal expansion coefficient ($\alpha$) for the HS material of a certain thickness ratio is measured.
(c) Young's modulus ratio ($E_{Cu}/E_M$) at various temperatures are determined based on (a) and (b) described above.
(d) $\alpha_{HS}$ at various thickness ratios are determined based on the measured values for the thermal expansion coefficient and the Young's modulus ratios in (a) and (b) described above.

For instance, in the case of pure Cu and Kovar material, thermal expansion curves as shown in FIG. 5a are obtained.

$\alpha_{HS}$ $$\alpha_{HS} = \alpha_M + \frac{(\alpha_{Cu} - \alpha_M)t_{Cu}E_{Cu}}{t_{Cu}E_{Cu} + t_M E_M}$$

$E_{Cu}/E_M$ $$E_{Cu}/E_M = \frac{(\alpha_M - \alpha_{HS})t_M}{(\alpha_{HS} - \alpha_{Cu})(1 - t_M)}$$

Thermal Expansion Coefficient $\alpha$ $\alpha_{Cu}$ = copper $\alpha_M$ = metal material of low thermal expansion Plate Thickness Ratio $t$ $t_{Cu}$ = copper $t_M$ = metal material of low thermal expansion Young's modulus ratio $E_{Cu}$ = copper $E_M$ = metal material of low thermal expansion coefficient The thickness ratio for each of the materials in the 3-layered clad portions of metal foil of low thermal expansion/Cu series substrate material/metal foil of low thermal expansion is properly selected in order to make the value for the thermal expansion coefficient of the Cu series substrate material at the portions selectively spot-clad with the metal foil of low thermal expansion to a required value nearly equal to that of a chip to be mounted.

The thickness ratio for each of the materials (metal foil of low thermal expansion/Cu series substrate material/metal foil of low thermal expansion) is preferably from 1:1:1 to 1:6:1.

As described above, metal foils of low thermal expansion of such material, thickness and size as selected in view of the kind and the thickness of the Cu series substrate, the size of the chip to be mounted, etc. are stacked, roll-bonded and rolled till a required thickness ratio is obtained. It is necessary that the metal foil of low thermal expansion selectively clad in a spot-like pattern along the longitudinal direction of the Cu series substrate material has pitch and size at high accuracy when it is fabricated into a lead frame.

The selective spot-clad material of pitch and size at high accuracy can be obtained by applying the steps such as provisional fixing, cutting and removal followed by roll-bonding and rolling like that in the first invention.

In particular, in the second invention, when the metal foils of low thermal expansion are stacked and roll-bonded, the foils may be selectively clad to both of the obverse and the reverse simultaneously, or it may be clad separately for the obverse and the reverse with a time delay. For instance, it is possible for at first provisionally fixing the metal foil on one surface of the uncoiled Cu series substrate material, then reversing the substrate by looping and, thereafter, provisionally fixing the metal foil to the other surface and then applying roll-bonding and rolling.

In addition to the manufacturing method using the roll-bonding and rolling mill as described above, the metal foil pieces can be embedded into and arranged on the Cu series substrate material also by means of pressing machine.

Figure 7B:
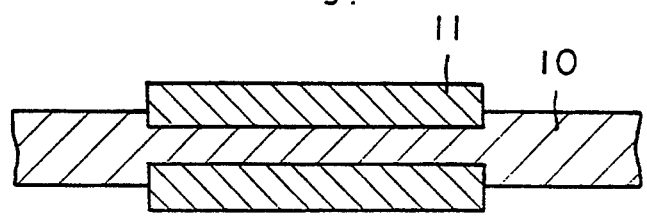
Figure 7C:
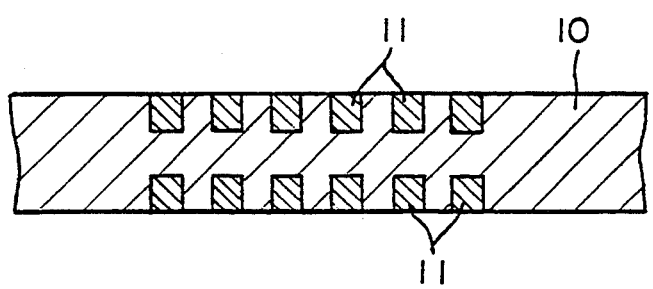

In a case where the metal foil 11 of low thermal expansion is bonded to the Cu series substrate material 10 by means of a so-called pin-down bonding, similar effect for preventing bending can also be obtained. Further, in a case where the metal foil 11 of low thermal expansion is embedded to the surface of the Cu series substrate material 10 on the both of the obverse and the reverse to the area to be formed with an island as shown in FIG. 7b, the bending preventive effect can similarly be obtained by merely seizing the metal foil 11 only at the thickness end face thereof along the thickness.

Ag or Au can be plated in a strip of or spot-like pattern to a predetermined position of the surface of the lead frame material according to the first and the second inventions on the side of mounting chips, that is, the surface including bonding area of the lead frame.

In the same way, foils of Ag, Au, Al, Cu, etc. can be roll-bonded and rolled in a strip of pattern depending on the kind of the bonding wire to predetermined positions of the lead frame material on the side of the surface to be mounted with chips. Further, by adopting the method of applying roll-bonding and rolling after cutting the foils into foil pieces and then provisionally fixing them.

In particular, in the lead frame material according to the first invention, when the metal foils of low thermal expansion are stacked and roll-bonded, they can be selectively clad on both of the obverse and the reverse simultaneously or can be separately clad for the both of the obverse and the reverse with a time delay. For instance, after provisionally fixing the metal foil of low thermal expansion previously to the uncoiled Cu series substrate material, the substrate may be reversed by looping and then the Ag foil, etc. can be fixed provisionally to the bonding area, followed by roll-bonding and rolling.

Further, when one or more of strip of pure copper foils at a purity of 99.9% or higher are cold or warm rolled to a thickness of 2 to 50 $\mu$m at the positions on the surface of the lead frame including the bonding area, Cu wires can be used for the bonding and the bonding operation can be applied easily and reliably in the assembling step for the Cu alloy lead Frame material of excellent heat dissipation without requiring expensive Au or Ag spot plating.

Preferred roll-bonding method includes a method of cleaning the surface with a softened wire brush, cold bonding them under pressure, applying diffusing annealing and then rolling to a required thickness. A thickness greater than 10 $\mu$m is preferred in view of a consideration that the surface of the pure Cu foil can maintain the property as the pure Cu having at purity of 99.9% or higher and can possess satisfactory bonding property and high mechanical strength.

EXAMPLE

Example 1

A lead Frame material corresponding to the first invention comprising a pure Cu substrate material sized 0.2×36.5×230 mm (t×w×l) was prepared for punching 8 lead frames for use in resin packages of 26-pin arrangement capable of mounting a chip sized 15.6×6.24×0.4 (thickness) mm.

That is, For obtaining a constitution as shown in FIG. 4a in which a metal foil 11 of low thermal expansion is roll-bonded to the surface reverse to an island $1_1$, since $m = S_{Si}/S_{Cu} = 2$, it can be seen From FIG. 5a that $K = 9.5$, $S_M/S_{Cu} = m = 0.8$, $n = 1.33$, $\alpha = 4 \times 10^6$ and $E = 15,000$. Accordingly, 36 Ni—Fe material with thickness of 0.16 mm or 3.4 mm is optimal For the metal foil of low thermal expansion coefficient.

Then, 36 Ni—Fe material was roll-bonded and rolled to attain the above-mentioned thickness ratio at 8 positions on the pure Cu substrate material, to manufacture lead frame materials in which metal foils of low heat expansion each sized 14.5×5.4 mm and having thickness of 0.16 mm or 3.4 mm were arranged in a spot-like manner.

When 50 resin packages were prepared by using the lead frame material described above and subjected to the mounting test, damages to the chips such as peeling or cracking were not observed at all.

Example 2

For obtaining a constitution of Example 1 in which the metal foil 11 of low thermal expansion is embedded to the inside of the island $1_1$ shown in FIG. 4b so as to be same thickness as other lead portion with respect to the thickness, it is set as: $m = S_{Si}/S_{Cu} = 4$, and the thickness of the pure Cu substrate material to 0.1 mm. Since $k = 7.5$ and, accordingly, since the thickness for the island $1_1$ is 0.2 mm from FIG. 5a, it can be seen that $S_M/S_{Cu} = m = 1$, $n = 1.33$, $\alpha = 7 \times 10^{-6}$ and $E = 15,000$, and Kovar material of 0.1 mm thickness is optimum for the metal foil of low thermal expansion.

Then, Kovar was roll-bonded and rolled to attain the above-mentioned thickness ratio at 8 positions on the pure Cu substrate material, to manufacture a lead frame material in which metal foils of low heat expansion each sized 14.4×5.2 mm and thickness of 0.1 mm were arranged in a spotlike pattern.

When 50 resin packages were prepared by using the lead frame material described above and subjected to the mounting test, damages to the chips such as peeling or cracking were not observed at all.

Example 3

When Kovar material was formed as a punched metal sheet and it was roll-bonded and rolled at 8 positions on the pure Cu substrate so as to be embedded to a thickness of 0.1 mm like that in Example 2, since the Cu substrate material was Filled into the punched apertures of the Kovar material upon roll-bonding, the plate shape after the roll-bonding was extremely satisfactory and, when 50 resin packages were prepared by using the lead frame material described above and subjected to the mounting test, damages to the chips such as peeling or cracking were not observed at all.

Example 4

A lead frame material corresponding to the second invention comprising a pure Cu substrate material sized 0.2×36.5×230 mm (t×w×l) was prepared for punching 8 lead frames for use in resin package of 26-pin arrangement capable of mounting a chip sized 15.6×6.24×0.4 (thickness) mm.

That is, for obtaining a constitution as shown in FIG. 8a in which a metal foil 11 of low thermal expansion is roll-bonded to the obverse and the reverse of an island $1_1$, 36 Ni—Fe material with thickness of 0.1 mm was selected for the metal foil of low thermal expansion coefficient so that the thickness ratio for each of the materials was M/Cu/M = 1:2:1.

Then, 36 Ni—Fe material was roll-bonded and rolled to attain the above-mentioned thickness ratio at 16 positions on the obverse and the reverse of the pure Cu substrate material, to manufacture lead frame material in which metal foils of low heat expansion each sized 14.5×5.4 mm and thickness of 0.1 mm were arranged in a spot-like pattern.

When 50 resin packages were prepared by using the lead frame material described above and subjected to the mounting test, damages to the chips such as peeling or cracking were not observed at all.

Example 5

For obtaining a constitution of Example 4 in which metal foil 11 of low thermal expansion is embedded to the inside of an island $1_1$ to be same thickness as other lead portions with respect to the thickness as shown in FIG. 8b, Kovar material of 0.063 mm thickness was selected for the metal foil of low thermal expansion such that the thickness ratio for each of the materials was: M/Cu/M = 1:1:1.

Then, the Kovar material was roll-bonded and rolled to embedded at the above-mentioned thickness ratio at 16 positions on the obverse and the reverse of the pure Cu substrate material, to manufacture a lead frame material in which metal foils of low heat expansion each sized 14.4×5.2 mm and thickness of 0.063 mm were arranged in a spot-like pattern.

When 50 resin packages were prepared by using the lead frame material described above and subjected to the mounting test, damages to the chips such as peeling or cracking were not observed at all.

As described above, since the lead frame material according to the present invention, in which metal foils of low thermal expansion are selectively clad in a spot-like pattern to the Cu series lead frame material on the side reverse to the surface where semiconductor chips are to be mounted or on the side of the surface where semi-conductor chips are to be mounted and on the side of the surface reverse to it comprises a Cu series substrate material, it has extremely excellent heat dissipation. Further, metal foils of required low thermal expansion are roll-bonded and embedded to the surface reverse to the island portion where chips are to be mounted, the material warps scarcely upon heating and the peeling at the bonding interface between the chip and the island, etc. can be prevented to obtain a highly reliable resin package.

What is claimed is:

1. In a semiconductor package which includes a Cu-Series metal lead frame that provides an island portion having opposite first and second sides and leads having inner ends and outer ends, a semiconductor chip attached to said first side of said island portion, and a block of resin enclosing and sealing said island portion, said semiconductor chip and said inner ends of said leads, such that heat generated by said semiconductor chip during use is dissipated through said island portion, said resin and said leads, said semiconductor chip and said island portion having differing coefficients of thermal expansion, the improvement wherein at least one metal foil having a low thermal expansion is attached to only said second side of said island portion so as to prevent warping of said island portion when said semiconductor chip becomes heated by substantially offsetting bending of said island portion caused by said heated semiconductor chip, thus improving the reliability of said semiconductor package.

2. In a semiconductor package which includes a Cu-series lead frame that provides an island portion having opposite first and second sides and leads having inner ends and outer ends, a semiconductor chip attached to said first side of said island portion, and a block of resin enclosing and sealing said island portion, said semiconductor chip and said inner ends of said leads, such that heat generated by said semiconductor chip during use is dissipated through said island portion, said resin and said leads, said semiconductor chip and said island portion having differing coefficients of thermal expansion, the improvement wherein at least one metal foil having a low thermal expansion is respectively attached to only said first side and said second side of said island portion, said metal foils and said island portion having equal thicknesses and together displaying a thermal expansion coefficient substantially equal to the thermal expansion coefficient of said semiconductor chip, thus preventing warping of said island portion when said semiconductor chip becomes heated and thereby improving the reliability of said semiconductor package.

3. In a resin package as defined in claim 1 or 2, wherein the metal foil of low thermal expansion is at least partially embedded in said island portion.

4. In a resin package as defined in claim 1 or 2, wherein the metal material of low thermal expansion is entirely embedded in said island portion.

5. In a resin package as defined in claim 4, wherein the metal material of low thermal expansion is a punched metal sheet.

6. In a resin package as defined in claim 1 or 2, wherein the metal material of low thermal expansion is an Ni—Fe series alloy.

7. In a resin package as defined in claim 1 or 2, wherein the metal material of low thermal expansion is an Ni—Co—Fe series alloy.

8. In a resin package as defined in claim 1 or 2, wherein the metal material of low thermal expansion is formed such that a metal sheet of low thermal expansion having a plurality of through holes in the direction of thickness is roll-bonded and integrated with at least one main surface of a copper-series metal sheet, so that copper-series metal is selectively exposed through said holes to the surface of the metal sheet of low thermal expansion.

9. In a resin package as defined in claim 1 or 2, wherein the substrate material comprises pure Cu.

10. In a resin package as defined in claim 1 or 2, wherein strip of or spot-like Ag or Au plating is applied to required positions on the side of the surface where the semiconductor chips are to be mounted.

11. In a resin package as defined in claim 1 or 2, wherein one of strip of or spot-like Ag foil, Au foil, Al foil and Cu foil is attached to the side of the surface where the semiconductor chips are to be mounted.

12. In a resin package as defined in claim 11, wherein pure copper foils at a purity of 99.9% or higher are attached to a thickness of 2 to 50 $\mu$m in a strip of pattern.

* * * * *